(12) United States Patent
Ando et al.

(10) Patent No.: US 10,319,826 B2
(45) Date of Patent: Jun. 11, 2019

(54) REPLACEMENT METAL GATE STACK WITH OXYGEN AND NITROGEN SCAVENGING LAYERS

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/485,727

(22) Filed: Apr. 12, 2017

(65) Prior Publication Data

US 2018/0301540 A1 Oct. 18, 2018

(51) Int. Cl.
| | |
|---|---|
| *H01L 21/70* | (2006.01) |
| *H01L 29/49* | (2006.01) |
| *H01L 29/66* | (2006.01) |
| *H01L 21/285* | (2006.01) |
| *H01L 21/28* | (2006.01) |
| *H01L 29/78* | (2006.01) |

(52) U.S. Cl.
CPC .... *H01L 29/4966* (2013.01); *H01L 21/28088* (2013.01); *H01L 21/28556* (2013.01); *H01L 29/66545* (2013.01); *H01L 29/78* (2013.01)

(58) Field of Classification Search
CPC ............. H01L 29/4966; H01L 29/78; H01L 21/28088; H01L 29/66545; H01L 21/28556
See application file for complete search history.

(56) References Cited

U.S. PATENT DOCUMENTS

| | | | |
|---|---|---|---|
| 7,078,748 B2 | 7/2006 | Goldbach et al. |
| 8,597,995 B2 | 12/2013 | Xu |
| 8,776,379 B2 | 7/2014 | Liu et al. |
| 8,865,581 B2 | 10/2014 | Clark |
| 8,912,061 B2 | 12/2014 | Frank |
| 8,912,067 B2 | 12/2014 | Huguenin et al. |
| 8,941,169 B2 | 1/2015 | Frank |
| 9,040,369 B2 | 5/2015 | Siddiqui et al. |
| 9,059,211 B2 | 6/2015 | Chudzik et al. |
| 9,196,707 B2 | 11/2015 | Chudzik et al. |
| 9,257,289 B2 | 2/2016 | Leobandung et al. |

(Continued)

OTHER PUBLICATIONS

Takashi Ando, "Ultimate Scaling of High-K Gate Dielectrics: Higher-K or Interfacial Layer Scavenging?", Materials 2012. vol. 5. Mar. 14, 2012. pp. 478-500.

(Continued)

*Primary Examiner* — Ismail A Muse
(74) *Attorney, Agent, or Firm* — Tutunjian & Bitetto, P.C.; Vazken Alexanian (57) ABSTRACT

A method is presented for tuning work functions of transistors. The method includes forming a high-k dielectric over a semiconductor substrate, and forming a work function stack over the high-k dielectric, the work function stack including a first layer having a nitrogen (N) scavenging element, a second layer having an oxygen (O) scavenging element, and a third layer being a conducting layer.

20 Claims, 6 Drawing Sheets

(56) References Cited

U.S. PATENT DOCUMENTS

| | | | |
|---|---|---|---|
| 2004/0152307 A1* | 8/2004 | Pan | H01L 21/28556 438/687 |
| 2005/0277292 A1* | 12/2005 | Peng | H01L 21/28562 438/672 |
| 2010/0001253 A1* | 1/2010 | Arnold | H01L 45/06 257/4 |
| 2013/0075826 A1* | 3/2013 | Xu | H01L 29/4966 257/369 |
| 2014/0315360 A1* | 10/2014 | Liu | H01L 21/28079 438/199 |
| 2015/0021694 A1* | 1/2015 | Trevino | H01L 21/823821 257/368 |
| 2015/0200100 A1* | 7/2015 | Kuo | H01L 29/4966 438/591 |
| 2015/0228730 A1* | 8/2015 | Yang | H01L 27/092 257/369 |
| 2015/0243505 A1* | 8/2015 | Wang | H01L 29/6681 438/283 |
| 2015/0263004 A1* | 9/2015 | Cheon | H01L 29/4966 257/392 |
| 2015/0287645 A1* | 10/2015 | Zhao | H01L 21/82 438/200 |
| 2015/0380412 A1* | 12/2015 | Huang | H01L 21/823807 257/192 |
| 2016/0049483 A1* | 2/2016 | Zhang | H01L 29/66545 257/401 |
| 2016/0148930 A1* | 5/2016 | Shin | H01L 29/4966 257/192 |
| 2016/0196976 A1* | 7/2016 | Dekkers | H01L 21/823842 257/412 |
| 2016/0254157 A1 | 9/2016 | Jangjian et al. | |
| 2016/0293721 A1* | 10/2016 | Chuang | H01L 21/28088 |
| 2016/0379864 A1* | 12/2016 | Liu | H01L 23/5226 438/618 |
| 2017/0125298 A1* | 5/2017 | Jangjian | H01L 21/82345 |
| 2017/0186882 A1* | 6/2017 | Koldiaev | H01L 29/78696 |
| 2017/0229462 A1* | 8/2017 | Kim | H01L 27/0922 |
| 2018/0294219 A1* | 10/2018 | Kim | H01L 23/528 |

OTHER PUBLICATIONS

Sidney W. Benson, "Bond Energies", Journal of Chemical Education. Resource Papers—III—The Advisory Council on College Chemistry. vol. 42, No. 9. Sep. 1, 1965. pp. 502-518.

B. deB. Darwent, "Bond Dissociation Energies in Simple Molecules", National Standard Reference Data System—National Bureau of Standards—United States Department of Commerce. vol. 31. Jan. 1, 1970. pp. 1-60.

John A. Dean, "Lange's Handbook of Chemistry", Fifteenth Edition. McGraw-Hill, Inc. Oct. 30, 1998. pp. 1-1561.

C.L. Hinkle et al, "Dipole Controlled Metal Gate with Hybrid Low Resistivity Cladding for Gate-Last CMOS with Low Vt", 2010 Symposium on VLSI Technology Digest of Technical Papers. Jun. 15-17, 2010. pp. 183-184.

J.A. Kerr, "Bond Dissociation Energies by Kinetic Methods", Chemical Reviews. vol. 66, No. 5. Sep. 26, 1966. pp. 465-500.

* cited by examiner

REPLACEMENT METAL GATE STACK WITH OXYGEN AND NITROGEN SCAVENGING LAYERS

BACKGROUND

Technical Field

The present invention relates generally to semiconductor devices, and more specifically, to a replacement metal gate stack with oxygen and nitrogen scavenging layers.

Description of the Related Art

There is great difficulty in maintaining performance improvements in devices of deep submicron generations. Thus, methods for improving performance without scaling down dimensions have become of interest. There is a promising avenue toward higher gate capacitance without having to make the gate dielectric thinner. This approach involves the use of high-k materials. The dielectric constant of such materials is higher than that of silicon dioxide ($SiO_2$). A high-k material can physically be thicker than an oxide and still have a lower equivalent oxide thickness (EOT) value.

High performance small field effect transistor (FET) devices are in need of precise threshold voltage control. As operating voltage decreases, threshold voltages also have to decrease, and threshold variation becomes less tolerable. Every new element, such as a different gate dielectric, or a different gate material, influences the threshold voltage. Techniques exist to tune device thresholds through the modification of the gate work function.

SUMMARY

In accordance with an embodiment, a method is provided for tuning a work function of a transistor having a dummy gate structure between a set of spacers. The method includes forming source/drain regions within a semiconductor substrate, forming a high-k dielectric over the semiconductor substrate, removing the dummy gate structure to define a recess, and forming a work function stack within the recess, the work function stack including a first layer having a nitrogen (N) scavenging element, a second layer having an oxygen (O) scavenging element, and a third layer being a conducting layer.

In accordance with another embodiment, a semiconductor device is provided for tuning a work function of a transistor having a dummy gate structure between a set of spacers. The semiconductor device includes source/drain regions formed within a semiconductor substrate, a high-k dielectric formed over the semiconductor substrate, and a work function stack formed within a recess defined after removing the dummy gate structure, the work function stack including a first layer having a nitrogen (N) scavenging element, a second layer having an oxygen (O) scavenging element, and a third layer being a conducting layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for tuning work functions of transistors. A variety of different work-function setting metal stacks can be used. In one example, a metal based work function setting gate stack is employed. Additionally, in one example, another metal is introduced as a nitrogen (N) scavenger in the metal gate stack. The nitrogen (N) scavenger does not interfere with tunability of the work function of the transistors because it does not scavenge oxygen (O) from the high-k gate dielectric. The co-existence of metal-doped nitride and an oxygen scavenging metal layer in a metal gate stack is unique. Moreover, the metal-doped nitride layer can be deposited by atomic layer deposition (ALD).

Embodiments in accordance with the present invention provide methods and devices for forming a metal gate stack including, e.g., three layers. Each layer can be a doped metal layer. The first layer can be, e.g., a titanium tantalum nitride (TiTaN) layer. The second layer can be, e.g., a titanium aluminum carbon (TiAlC) layer or a titanium aluminum (TiAl) layer. The third layer can be e.g., a TiN or a TiTaN layer. The first layer can be a nitrogen (N) scavenging layer without oxygen (O) scavenging. The second layer can be an oxygen scavenging layer for tuning the effective work function.

If tantalum (Ta) is employed for doping the first and third layers, then such layers can act as N-scavenging layers. By including Ta into the first and third layers, the effective work function (EWF) is not affected since Ta is not an O-scavenger. Aluminum (Al) is employed in the second layer to create Vo in the high-k layer formed underneath the metal gate stack, and thereby control the EWF. The EWF is tunable between 4.2 eV and 4.9 eV, which is applicable to both nFET and pFET devices. Therefore, the exemplary embodiments of the present invention form a metal gate stack including a nitrogen scavenging layer (e.g., Ta-doped metal nitride) and an oxygen scavenging layer (e.g., Al-containing alloy) for a gate electrode. As a result, the nitrogen (N) scavenging and oxygen (O) scavenging can be compatible within a single metal gate structure.

Examples of semiconductor materials that can be employed include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

ALD is a gas phase chemical process used to create extremely thin coatings. The majority of ALD reactions use two chemicals, called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually 1-500 nm. ALD can be used to deposit several types of thin films, including various ceramics, from conductors to insulators.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
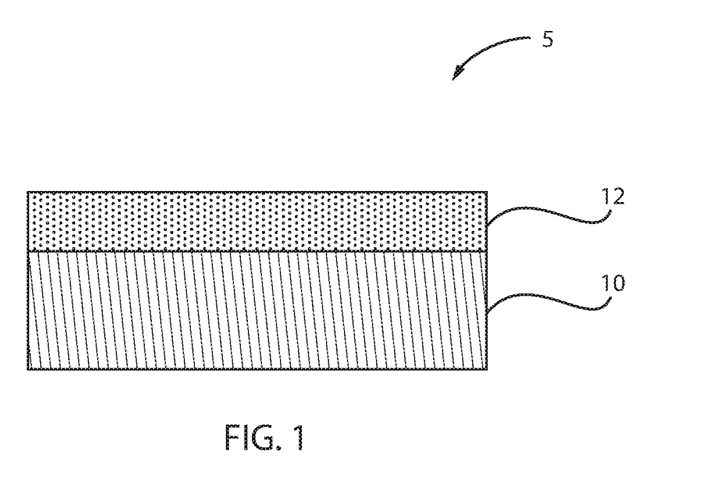
FIG. 1 is a cross-sectional view of a semiconductor structure having an interfacial layer (IL) formed thereon, in accordance with an embodiment of the present invention.

FIG. 1 is a cross-sectional view of a semiconductor structure having an interfacial layer (IL) formed thereon, in accordance with an embodiment of the present invention.

A semiconductor structure 5 includes a semiconductor substrate 10. An interfacial layer (IL) 12 can be formed over the semiconductor substrate 10.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The substrate 10 can include a semiconductor layer thereon. The semiconductor material of the substrate semiconductor layer can be appropriately doped either with p-type dopant atoms or with n-type dopant atoms. The dopant concentration of the substrate semiconductor layer can be from $1.0 \times 10^{15}/cm^3$ to $1.0 \times 10^{19}/cm^3$, and usually from $1.0 \times 10^{16}/cm^3$ to $3.0 \times 10^{18}/cm^3$, although lesser and greater dopant concentrations are contemplated herein also. Preferably, the substrate semiconductor layer is single crystalline. The semiconductor substrate 10 can be a bulk substrate, a semiconductor-on-insulator (SOI) substrate, or a hybrid substrate. The semiconductor substrate 10 may, or may not, have a built-in stress in a substrate semiconductor layer. While the present invention is described with a bulk substrate, implementation of the present invention on an SOI substrate or on a hybrid substrate is explicitly contemplated herein.

In an exemplary embodiment, the IL 12 is formed by a chemical oxide process such as by a wet chemical oxidation that includes treating the cleaned semiconductor surface 10 (e.g., by hydrofluoric acid) with a mixture of ammonium hydroxide, hydrogen peroxide and water (in a 1:1:5 ratio) at about 65° C. Alternatively, the chemical oxide layer can also be formed by treating the HF-last semiconductor surface in ozonated aqueous solutions, with the ozone concentration usually varying from, but not limited to: 2 parts per million (ppm) to 40 ppm. However, it will be appreciated that the IL 12 can be formed by other processes known in the art such as, for example, by atomic layer deposition (ALD) of $SiO_2$ or by rapid thermal anneal (RTA) in an $O_2$ or $NH_3$ ambient environment. The formation of the IL 12 allows for nucleation of a high-k dielectric layer 14 (described below) formed thereon, which includes a dielectric metal oxide having a dielectric constant that is greater than the dielectric constant (7.5) of silicon nitride.

Figure 2:
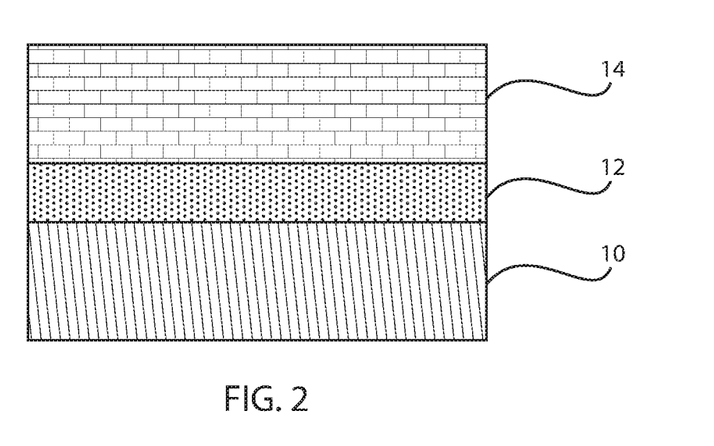
FIG. 2 is a cross-sectional view of the semiconductor structure of FIG. 1 where a high-k layer is deposited over the IL, in accordance with an embodiment of the present invention.

FIG. 2 is a cross-sectional view of the semiconductor structure of FIG. 1 where a high-k layer is deposited over the IL, in accordance with an embodiment of the present invention.

In various embodiments, a high-k material layer 14 can be formed over the interfacial layer (IL) 12.

In one or more embodiments, the high-k material layer 12 can have a thickness in the range of about 1 nm to about 10 nm, or in the range of about 1.5 nm to about 3 nm.

The high-k material layer 12 can be selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from about 0 to about 2.

Figure 3:
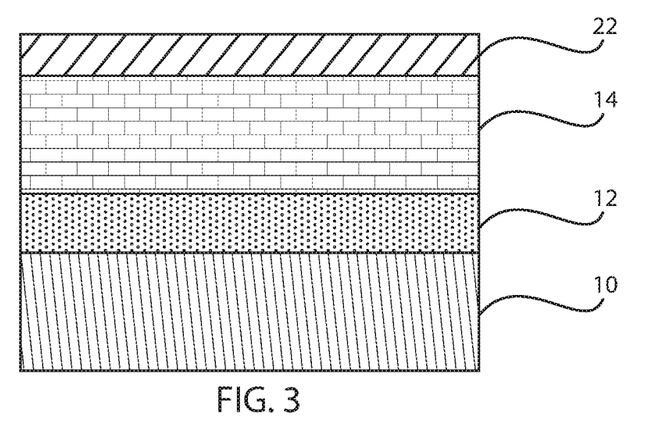
FIG. 3 is a cross-sectional view of the semiconductor structure of FIG. 2 where a metal layer, such as a titanium tantalum nitride (TiTaN) layer is deposited over the high-k layer, in accordance with an embodiment of the present invention.

FIG. 3 is a cross-sectional view of the semiconductor structure of FIG. 2 where a titanium tantalum nitride (TiTaN) layer is deposited over the high-k layer, in accordance with an embodiment of the present invention.

In various embodiments, a work function metal stack 20 (FIG. 5) can be formed over the high-k material layer 14. The work function metal stack 20 includes, e.g., three layers. A first layer 22 (FIG. 3), a second layer 24 (FIG. 4), and a third layer 26 (FIG. 5). The first layer 22 can be, e.g., a doped metal layer. The doped metal layer can be, a titanium tantalum nitride (TiTaN) layer 22. Layer 22 can be configured to be a nitrogen (N) scavenging layer without scavenging oxygen (O). The Ta-doped metal nitride layer can be deposited by laminating atomic layer deposition (ALD) TaN and ALD TiN. The Ta concentration can be tuned by changing a cycle ratio.

Moreover, the metallic layers 22 (or 26) can be selected from the group of TiN, TiC, TaN, TaC, and combinations thereof. As used herein, transition metals include elements from Group 3B, 4B, 5B, 6B, 7B, 8B, 1B, and 2B and lanthanides and actinides in the periodic table of elements. In one example, the first metallic layer 22 and the second metallic layer 26 are the same material. In another case, the first metal layer 22 and the second metal layer 26 are different materials.

Figure 4:
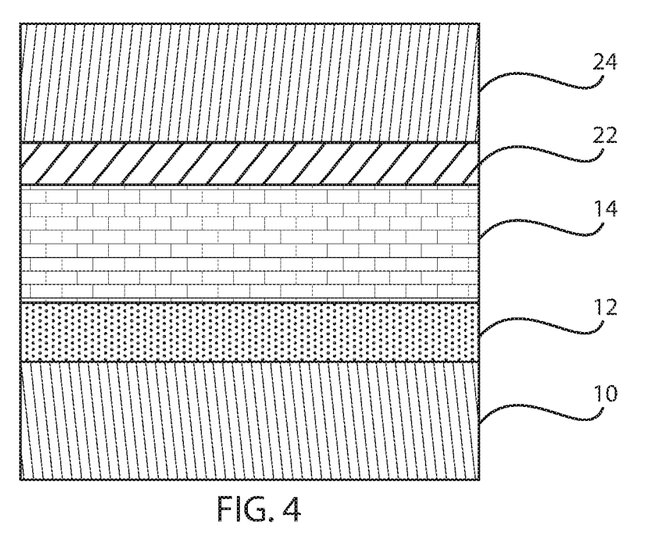
FIG. 4 is a cross-sectional view of the semiconductor structure of FIG. 3 where a metal layer, such as a titanium aluminum carbon (TiAlC) layer is deposited over the TiTaN layer, in accordance with an embodiment of the present invention.
Figure 5:
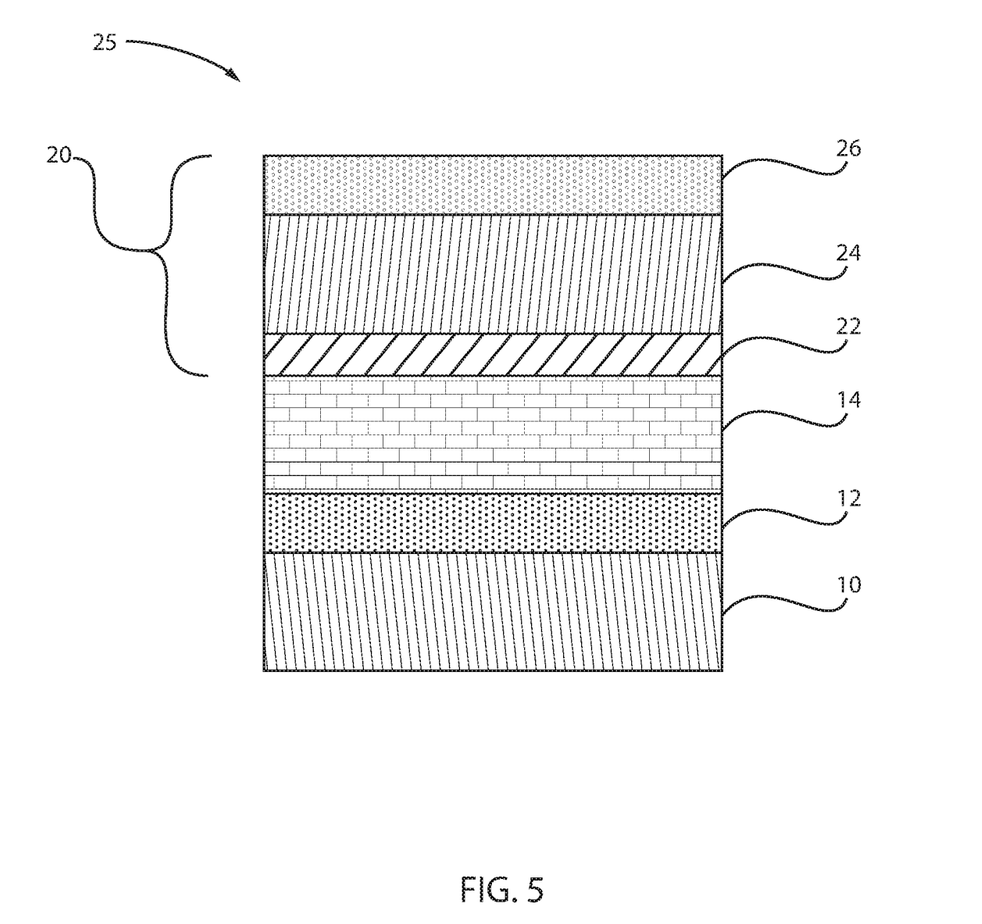
FIG. 5 is a cross-sectional view of the semiconductor structure of FIG. 4 where a metal layer, such as a TiN layer is deposited over the TiAlC layer to form a metal gate stack, in accordance with an embodiment of the present invention.

FIG. 4 is a cross-sectional view of the semiconductor structure of FIG. 3 where a titanium aluminum carbon (TiAlC) layer is deposited over the TiTaN layer, in accordance with an embodiment of the present invention.

In various embodiments, the second layer 24 can be, e.g., a doped metal layer. The doped metal layer can be, e.g., a titanium aluminum carbon (TiAlC) layer. Alternatively, the second layer 24 can be, e.g., a titanium aluminum (TiAl) layer.

The scavenging metal layer 24 is selected so as to "scavenge" impurity oxygen from neighboring metallic and high-k layers during subsequent processing, and can include a metal such as, but not limited to: Al, Be, Mg, Ca, Sr, Ba, Sc, Y, La, Ti, Zr, Hf, Dy, Lu, Er, Pr, and Ce. In one embodiment, the scavenging metal layer 24 includes at least one alkaline earth metal. In another embodiment, the scavenging metal layer 24 includes at least one transition metal. In yet another embodiment, the scavenging metal layer 24 includes a mixture of at least one alkaline earth metal and at least one transition metal.

In one specific embodiment, the material for the scavenging metal layer 24 is selected such that the Gibbs free energy change of a chemical reaction, in which an atom constituting a channel combines with a metal oxide material including the doped metal and oxygen to form the doped metal in elemental form and oxide of the atom constituting the channel, is positive. A particular advantageous choice for the scavenging metal layer 24 is an aluminum layer including aluminum in elemental metal form. Thus, one exemplary embodiment of the doped metal layer 24 is TiAlC or TiAl.

The material of the scavenging metal layer 24 "scavenges" impurity oxygen from neighboring metallic and high-k layers during subsequent processing. For the scavenging metal layer 24 to effectively scavenge impurity oxygen in subsequent processing steps, it is necessary that introduction of oxygen into the scavenging metal layer 24 is suppressed during the formation step. Further, it is necessary to select the material for the scavenging metal layer 24 so that the material of the scavenging metal layer 24 effectively scavenges impurity oxygen atoms from the lower metal layer 22 (e.g., TiTaN) and the upper metal layer 26 (e.g., TiN, TiTaN) to be subsequently formed.

Preferably, the thickness of the scavenging metal layer 24 can be, e.g., from about 0.1 nm to about 3.0 nm, although lesser and greater thicknesses are also contemplated herein.

FIG. 5 is a cross-sectional view of the semiconductor structure of FIG. 4 where a TiN layer is deposited over the TiAlC layer to form a metal gate stack, in accordance with an embodiment of the present invention.

In various embodiments, the third layer 26 can be, e.g., another doped metal layer. The doped metal layer can be, e.g., TiN layer or a TiTaN layer. The work function metal stack 20 can also be referred to as an aluminum (Al)-based work function metal stack. The Ta-doped metal nitride layer can be deposited by laminating atomic layer deposition (ALD) TaN and ALD TiN. The Ta concentration can be tuned by changing a cycle ratio.

Tantalum (Ta) can be doped in layers 22 and 26 so that such layers act as N-scavenging layers. Nitrogen diffusion into the interfacial layer and the channel causes an increase of interface state density (Dit). This results in degradation of carrier mobility and sub-threshold slope of the transistor. The nitrogen scavenging layer prevents nitrogen diffusion and concomitant degradation in device characteristics.

Further, by including Ta into layers 22, 26, the effective work function (EWF) is not affected since Ta is not an O-scavenger. Aluminum (Al) is used in layer 24 to create oxygen vacancies (Vo) in high-k layer 14, and thereby control the EWF. The EWF is tunable between 4.2 eV and 4.9 eV, which is applicable to both nFET and pFET devices.

In one specific embodiment of an NFET device, the metal gate material stack 20 can include workfunction setting metal layers selected to set the workfunction around the silicon conduction band edge. Such workfunction setting metal layers can include, for example, layers of about 10 Å to about 30 Å thick titanium nitride and about 10 Å to about 30 Å thick tantalum nitride, followed by layers of about 10 Å to about 40 Å thick of titanium aluminum, which together make up a workfunction setting metal layer portion of the metal gate material stack 20. Alternatively, titanium aluminum nitride, tantalum aluminum, tantalum aluminum nitride, hafnium silicon alloy, hafnium nitride, or tantalum carbide can be used in the workfunction setting metal layer portion in lieu of the titanium aluminum.

In one specific embodiment of a PFET device, the metal gate material stack 20 includes workfunction setting metal layers selected to set the workfunction around the silicon valence band edge. Here, such workfunction setting metal layers can include, for example, layers of about 10 Å to about 30 Å thick titanium nitride and about 10 Å to about 30 Å thick tantalum nitride, followed by layers of about 30 Å to about 70 Å thick of titanium nitride and about 10 Å to about 40 Å thick layer of titanium aluminum, which together make up a workfunction setting metal layer portion of the metal gate material stack 20. Alternatively, tungsten, tantalum nitride, ruthenium, platinum, rhenium, iridium, or palladium can be used in the workfunction setting metal layer portion in lieu of the titanium nitride and titanium aluminum nitride, tantalum aluminum, tantalum aluminum nitride, hafnium silicon alloy, hafnium nitride, or tantalum carbide can be deposited instead of the titanium aluminum.

The thickness of the lower metal layer 22 and the upper metal layer 26 can be, e.g., from about 1 nm to about 100 nm, and preferably from about 3 nm to about 10 nm, although lesser and greater thicknesses are also contemplated herein. In one case, the lower metal layer 22 and the upper metal layer 26 are the same material (e.g., TiN or TiTaN). In another case, the lower metal layer 22 and the upper metal layer 26 can be different materials.

The upper metal layer 26 can be deposited directly on the top surface of the scavenging metal layer 24. The upper metal layer 26 can be formed, for example, by chemical vapor deposition (CVD), physical vapor deposition (PVD), or atomic layer deposition (ALD).

The scavenging metal layer 24 captures oxygen atoms from above and from below. Because the scavenging metal layer 24 is more prone to oxide formation than the lower metal layer 22, the upper metal layer 26, and the high-k material layer 14, the oxygen atoms are consumed within the scavenging metal layer 24 and oxygen vacancies are formed in the high-k material layer.

The "work function" (WF) is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal.

WF is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band; in the case, the minimum energy to remove an electron is about the sum of half the band gap and the electron affinity. An effective work function (eWF) is defined as the WF of metal on the dielectric side of a metal-dielectric interface.

The WF of a semiconductor material can be altered by doping the semiconductor material. For example, undoped polysilicon has a work function of about 4.65 eV, whereas polysilicon doped with boron has a work function of about 5.15 eV. When used as a gate electrode, the WF of a semiconductor or conductor directly affects the threshold voltage of the transistor.

The WF is a key parameter for setting the threshold voltage ($V_{th}$) of the complementary metal oxide semiconductor (CMOS) device, whether an n-type field effect transistor (FET) or a p-type FET. In order to obtain a good electrical control of the FET devices, the WF value should be close to the valence band of the semiconductor for a pFET and close to the conduction band of the semiconductor for an nFET, and more particularly, about 5.2 eV and about 4.0 eV, respectively for the pFET and nFET in the case of silicon (Si).

Regardless of the specific WF setting metal layers used in either an nFET or a pFET device, the remainder of the metal gate material stack can include a fill metal such as aluminum, titanium-doped aluminum, tungsten or copper to result in the metal gate material stack, as described further below in detail.

Figure 6:
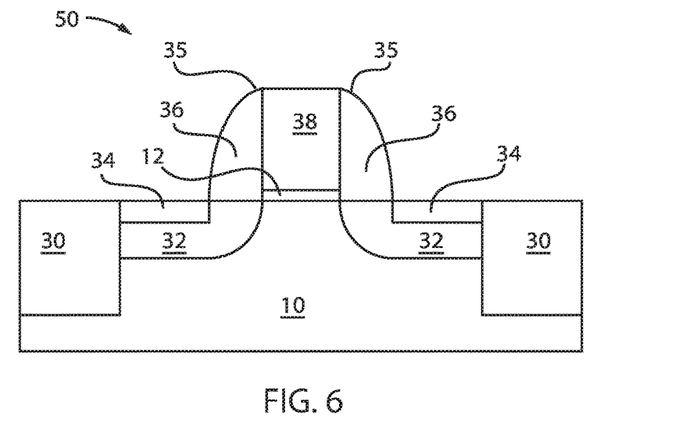
FIG. 6 is a cross-sectional view of a semiconductor structure where shallow trench isolation (STI) regions are formed, source/drain regions are formed, a dummy gate is deposited, and spacers are formed adjacent the dummy gate, in accordance with an embodiment of the present invention.

FIG. 6 is a cross-sectional view of a semiconductor structure where shallow trench isolation (STI) regions are formed, source/drain regions are formed, a dummy gate is deposited, and spacers are formed adjacent the dummy gate, in accordance with an embodiment of the present invention.

A semiconductor structure 50 includes a semiconductor substrate 10. Shallow trench isolation (STI) regions 30 are formed on the substrate 10. The STI regions 30 can be formed on opposed ends of the substrate 10. Source/drain regions 32 are also formed adjacent the STI regions 30. Silicide regions 34 are further formed within the source/drain regions 32. The silicide regions 34 can contact the STI regions 30. Spacers 36 can be formed over a portion of the source/drain regions 32 and on opposed ends of a dummy gate 38. A top end or surface 35 of the spacers 36 can be flush with a top surface of the dummy gate 38.

The shallow trench isolation (STI) regions 30 are formed by etching a trench in the substrate utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

In some embodiments, the silicide 34 can form automatically during the deposition of the metal. In such embodiments, the silicide formation can be assisted by raising the substrate temperature above the room temperature. In one example, the substrate temperature is about 150° C.

In some embodiments, silicide 34 is formed after the metal deposition by annealing at moderate temperatures. In such embodiments, the annealing time and temperature are kept low enough to avoid out-diffusion of hydrogen from c-Si:H and therefore formation of defects that would compromise active doping. In one example, annealing is performed at, e.g., about 150° C. for about ½ hour. In another example, annealing is performed at, e.g., about 200° C. for about 1 minute. In yet another example, annealing is performed at, e.g., about 300° C. for about 10 seconds.

In some embodiments, the formation of the silicide 34 requires depositing a refractory metal such as nickel (Ni) or titanium (Ti) onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

The spacers 36 can be formed by deposition followed by a directional etch (e.g., RIE). Spacers 36 can be formed along the sidewalls of the ILD 40. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 36. Spacer material can be silicon oxide, silicon oxynitride, silicon nitride, SiBCN, SiOCN, SiOC, or any suitable combination of those materials.

In various embodiments, an in-situ doped source/drain 32 is deposited or formed via epitaxial growth. Depending on how the epitaxial growth develops, it can be necessary to anisotropically etch the epitaxial growth.

The dopant can be provided to the doped region(s) 32 (i.e., source/drain region(s)) by ion implantation, and source/drains formed by annealing the doped region(s) 32. In various embodiments, the doped regions 32 can be n-doped or p-doped.

In various embodiments, the doped regions 32 can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 32 can include forming an in situ doped epitaxial semiconductor material over an ETSOI layer. The term "epitaxial semiconductor material" denotes a semiconductor material that has been formed employing an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 32 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 32.

Examples of silicon including source gases can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gases for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from about 550° C. to about 900° C. Although higher temperature typically results in faster deposition, the faster deposition can result in crystal defects and film cracking.

The epitaxial semiconductor material that provides the source and drain regions 32 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gases.

Figure 7:
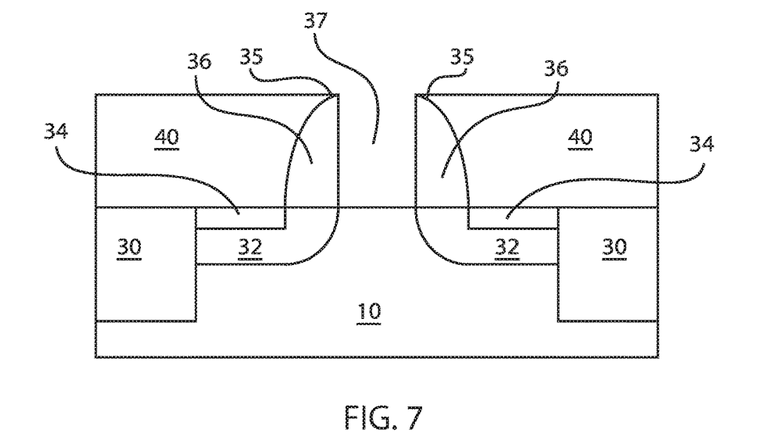
FIG. 7 is a cross-sectional view of the semiconductor structure of FIG. 6 where the dummy gate is removed, in accordance with an embodiment of the present invention.

FIG. 7 is a cross-sectional view of the semiconductor structure of FIG. 6 where the dummy gate is removed, in accordance with an embodiment of the present invention.

In various embodiments, the dummy gate 38 is removed to form a recess 37 between the spacers 36 and to expose a top surface of the substrate 10. Additionally, an inter-level dielectric (ILD) 40 is formed adjacent the spacers 36. ILD 40 is positioned directly over the silicide 34 and the STI regions 30.

In some embodiments, the ILD 40 is planarized. The ILD 40 can extend to a top surface 35 of the spacers 36. The height of the ILD 40 is approximately equal to the height of the spacers 36.

In various embodiments, the height of the ILD 40 can be reduced by chemical-mechanical polishing (CMP) and/or etching. Therefore, the planarization process can be provided by CMP. Other planarization process can include grinding and polishing.

In one or more embodiments, the ILD 40 can have a thickness in the range of about 3 nm to about 10 nm, or in the range of about 3 nm to about 5 nm.

The ILD 40 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 40 include any of the aforementioned materials in porous form, or in a form that changes during processing to or from being porous and/or permeable to being non-porous and/or non-permeable.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 8:
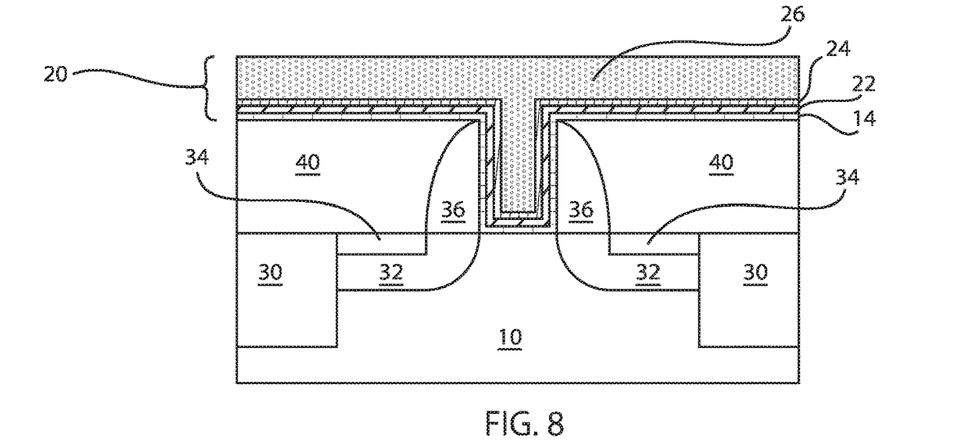
FIG. 8 is a cross-sectional view of the semiconductor structure of FIG. 7 where a high-k metal gate stack is formed, in accordance with an embodiment of the present invention.

FIG. 8 is a cross-sectional view of the semiconductor structure of FIG. 7 where a high-k metal gate stack is formed, in accordance with an embodiment of the present invention.

In various embodiments, a high-k dielectric layer 14 and a work function metal stack 20 are deposited over the ILD 40 and the spacers 36. The work function metal stack 20 includes, e.g., three layers. A first layer 22, a second layer 24, and a third layer 26.

The first layer 22 can be, e.g., a doped metal layer. The doped metal layer can be, a titanium tantalum nitride (TiTaN) layer 22. Layer 22 can be configured to be a nitrogen (N) scavenging layer without scavenging oxygen (O). The Ta-doped metal nitride layer can be deposited by laminating atomic layer deposition (ALD) TaN and ALD TiN. The Ta concentration can be tuned by changing a cycle ratio.

The second layer 24 can be, e.g., a doped metal layer. The doped metal layer can be, e.g., a titanium aluminum carbon (TiAlC) layer. Alternatively, the second layer 24 can be, e.g., a titanium aluminum (TiAl) layer. The scavenging metal layer 24 is selected so as to "scavenge" impurity oxygen from neighboring metallic and high-k layers during subsequent processing.

The third layer 26 can be, e.g., another doped metal layer. The doped metal layer can be, e.g., TiN layer or a TiTaN layer. The work function metal stack 20 can also be referred to as an aluminum (Al)-based work function metal stack. The Ta-doped metal nitride layer can be deposited by laminating atomic layer deposition (ALD) TaN and ALD TiN. The Ta concentration can be tuned by changing a cycle ratio.

Figure 9:
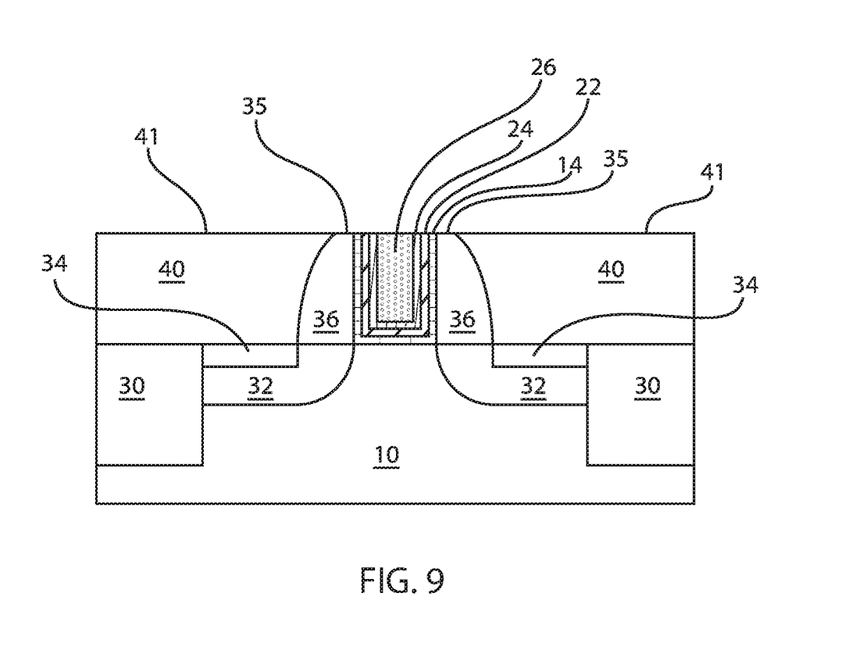
FIG. 9 is a cross-sectional view of the semiconductor structure of FIG. 8 where the high-k metal gate stack is planarized, in accordance with an embodiment of the present invention.

FIG. 9 is a cross-sectional view of the semiconductor structure of FIG. 8 where the high-k metal gate stack is planarized, in accordance with an embodiment of the present invention.

In various embodiments, the metal gate stack 20 is planarized. A conventional planarization process such as chemical-mechanical polishing (CMP) can optionally be used to provide a planar structure.

Figure 10:
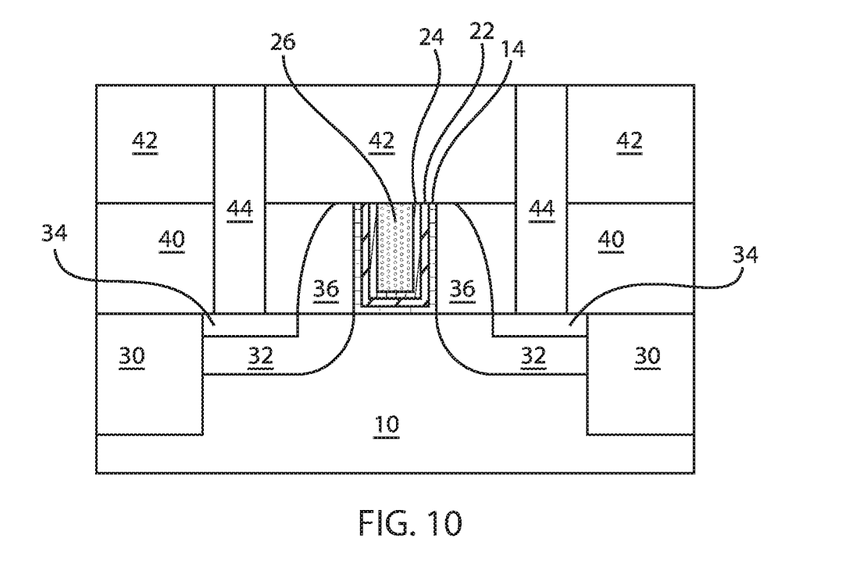
FIG. 10 is a cross-sectional view of the semiconductor structure of FIG. 9 where an inter-level dielectric (ILD) is deposited and contacts are formed, in accordance with an embodiment of the present invention.

FIG. 10 is a cross-sectional view of the semiconductor structure of FIG. 9 where an inter-level dielectric (ILD) is deposited and contacts are formed, in accordance with an embodiment of the present invention.

In various embodiments, ILD 42 is deposited over the existing ILD 40, as well as over the spacers 36 and the metal gate stack 20. Contacts 44 can also be formed that extend to the silicide 34. Thus, FIG. 10 illustrates the final structure of a replacement metal gate stack with oxygen and nitrogen scavenging layers.

Figure 11:
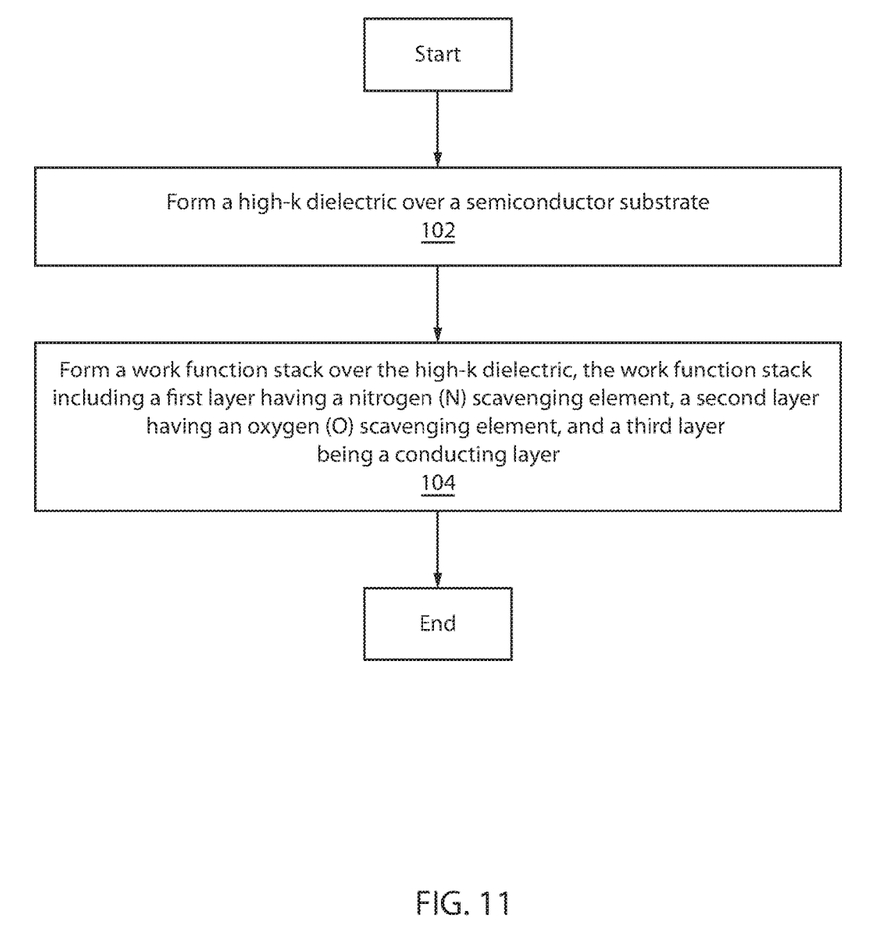
FIG. 11 is a block/flow diagram of an exemplary method for tuning work functions of transistors, in accordance with an embodiment of the present invention.

FIG. 11 is a block/flow diagram of an exemplary method for tuning work functions of transistors, in accordance with an embodiment of the present invention.

At block 102, a high-k dielectric is formed over a semiconductor substrate.

At block 104, a work function stack is formed over the high-k dielectric, the work function stack including a first layer having a nitrogen (N) scavenging element, a second layer having an oxygen (O) scavenging element, and a third layer being a conducting layer.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for creating a replacement metal gate stack with oxygen and nitrogen scavenging layers (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for tuning a work function of a transistor having a dummy gate structure between a set of spacers, the method comprising:
    forming a high-k dielectric over a semiconductor substrate;
    removing the dummy gate structure to define a recess; and
    forming a three-layer work function stack within the recess, the three-layer work function stack within the recess including a first layer having a nitrogen (N) scavenging element, a second layer having an oxygen (O) scavenging element, and a third layer being a conducting layer, where the first, second, and third layers are constructed to include a common metal;
    wherein the first layer is a tantalum (Ta) doped metal nitride layer, the second layer is a titanium aluminum (TiAl) layer, and the third layer is a TiN layer.

2. The method of claim 1, wherein the nitrogen (N) scavenging element is tantalum (Ta).

3. The method of claim 1, wherein the oxygen (O) scavenging element is aluminum (Al).

4. The method of claim 1, further comprising forming source/drain regions within the semiconductor substrate.

5. The method of claim 1, wherein the first layer is a tantalum (Ta) doped metal nitride layer, the second layer is a titanium aluminum carbon (TiAlC) layer, and the third layer is a TiN layer.

6. The method of claim 1, wherein the third layer is a titanium nitride (TiN) layer.

7. The method of claim 1, wherein the third layer is a titanium tantalum nitride layer (TiTaN).

8. The method of claim 1, wherein a concentration of the nitrogen (N) scavenging element of the first layer is tuned by changing a cycle ratio.

9. The method of claim 1, wherein the first layer prevents any type of oxygen (O) scavenging to occur.

10. A structure for tuning a work function of a transistor having a dummy gate structure between a set of spacers, the structure comprising:

a high-k dielectric formed over a semiconductor substrate; and a three-layer work function stack formed within a recess defined after removing the dummy gate structure, the three-layer work function stack within the recess including a first layer having a nitrogen (N) scavenging element, a second layer having an oxygen (O) scavenging element, and a third layer being a conducting layer, where the first, second, and third layers are constructed to include a common metal;

wherein the first layer is a tantalum (Ta) doped metal nitride layer, the second layer is a titanium aluminum (TiAl) layer, and the third layer is a TiN layer.

11. The structure of claim 10, wherein the nitrogen (N) scavenging element is tantalum (Ta).

12. The structure of claim 10, wherein the oxygen (O) scavenging element is aluminum (Al).

13. The structure of claim 10, wherein source/drain regions are formed within the semiconductor substrate.

14. The structure of claim 10, wherein the first layer is a tantalum (Ta) doped metal nitride layer, the second layer is a titanium aluminum carbon (TiAlC) layer, and the third layer is a TiN layer.

15. The structure of claim 10, wherein the third layer is a titanium nitride (TiN) layer.

16. The structure of claim 10, wherein the third layer is a titanium tantalum nitride layer (TiTaN).

17. The structure of claim 10, wherein a concentration of the nitrogen (N) scavenging element of the first layer is tuned by changing a cycle ratio.

18. The structure of claim 10, wherein the first layer prevents any type of oxygen (O) scavenging to occur.

19. A method for tuning a work function of a transistor having a dummy gate structure between a set of spacers, the method comprising:

forming source/drain regions within a semiconductor substrate;

forming a high-k dielectric over the semiconductor substrate;

removing the dummy gate structure to define a recess; and forming a three-layer work function stack within the recess, the three-layer work function stack within the recess including a first layer having a nitrogen (N) scavenging element, a second layer having an oxygen (O) scavenging element, and a third layer being a conducting layer, where the first, second, and third layers are constructed to include a common metal;

wherein the first layer is a tantalum (Ta) doped metal nitride layer, the second layer is a titanium aluminum (TiAl) layer, and the third layer is a TiN layer.

20. The method of claim 19, wherein the first layer prevents any type of oxygen (O) scavenging to occur.

* * * * *